(12) United States Patent
O et al.

(10) Patent No.: US 7,333,312 B2
(45) Date of Patent: Feb. 19, 2008

(54) ESD DEVICE WITH LOW TRIGGER VOLTAGE AND LOW LEAKAGE

(75) Inventors: Hugh Sungki O, Fremont, CA (US); Chih-Ching Shih, Pleasanton, CA (US); Cheng-Hsiung Huang, Cupertino, CA (US); Yow-Juang Bill Liu, San Jose, CA (US)

(73) Assignee: Altera Corporation, San Jose, CA (US)

( * ) Notice: Subject to any disclaimer, the term of this patent is extended or adjusted under 35 U.S.C. 154(b) by 202 days.

(21) Appl. No.: 11/173,254

(22) Filed: Jul. 1, 2005

(65) Prior Publication Data

US 2007/0002507 A1    Jan. 4, 2007

(51) Int. Cl.
*H02H 9/00* (2006.01)
(52) U.S. Cl. ........................................................ 361/56
(58) Field of Classification Search ................. 361/56, 361/111
See application file for complete search history.

(56) References Cited

U.S. PATENT DOCUMENTS

| 5,717,560 | A * | 2/1998 | Doyle et al. | 361/56 |
| 2004/0042143 | A1* | 3/2004 | Ker et al. | 361/111 |
| 2006/0114628 | A1* | 6/2006 | Fukuda | 361/56 |

* cited by examiner

*Primary Examiner*—Michael Sherry
*Assistant Examiner*—Boris Benenson
(74) *Attorney, Agent, or Firm*—Morgan, Lewis & Bockius LLP

(57) ABSTRACT

An ESD device invention comprises first and second transistors formed in a substrate, each having a source, a drain and a gate, the source and drain of the first transaction being connected between ground and an I/O pin or input, the gate of the first transistor being connected to ground and the source and drain of the second transistor being connected between the substrate of the first transistor and the I/O pin or input; first and second capacitors connected in series between ground and the I/O pin or input; and at least a third transistor connected between ground and a node between the first and second capacitors to which the gate of the second transistor is also connected.

22 Claims, 4 Drawing Sheets

100

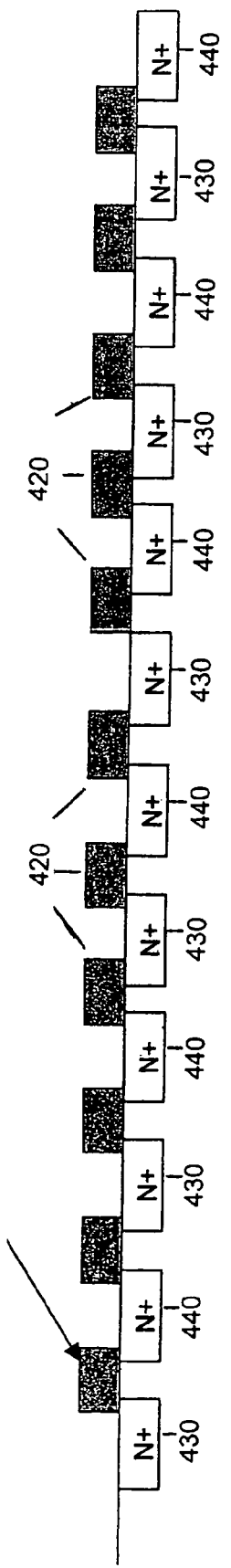

US 7,333,312 B2

1

ESD DEVICE WITH LOW TRIGGER VOLTAGE AND LOW LEAKAGE

BACKGROUND OF THE INVENTION

Parasitic bipolar transistors in NMOS devices are commonly used for protecting integrated circuit pins from ESD damage. The bipolar transistors turn on when current is injected into the base to forward-bias the base/emitter junction. Several trigger devices can be used for injecting the base current. They include resistors, diode strings, and grounded-gate transistors. A normally-on native NMOS device with threshold voltage close to zero was proposed recently as a trigger device in M. D. Ker and K. C. Hsu, "Native-NMOS-triggered SCR (NANSCR) for ESD protection in 0.13-um CMOS integrated circuits", International Reliability Physics Symposium, Page 381, 2004.

However, if resistors are used for the trigger, large leakage will occur during normal operation. And diode strings are also prone to leakage due to the Darlington effect. While grounded-gate transistors have low leakage, the trigger voltage is high because of the high junction breakdown voltage required to deliver the base current to the parasitic bipolar transistor. Typical 3.3V I/O transistors have a junction breakdown voltage of 7.5V. And the native NMOS transistor has high leakage and can only be shut off if a negative bias is applied to its gate. This requires an on-chip negative-voltage generator to deliver the negative bias.

In the case of a core NMOS transistor with grounded gate and substrate, the junction breakdown voltage is so close to the oxide breakdown voltage that the oxide cannot be protected reliably. For example, in 90 nm technology the junction breakdown voltage is about 4.2 Volts, very close to the oxide breakdown voltage of 4.5 Volts.

If the foregoing NMOS transistors are used to discharge ESD, the trigger voltage is high, and the ESD current is not uniform. This is due to the junction breakdown voltage required for generating substrate current to bias the base of each parasitic bipolar transistor. It is highly desirable to turn on the parasitic bipolar transistors below the junction breakdown voltage; but this requires external currents to be injected to the bases of the NMOS ESD devices. While this method has been used as described in C. H. Lai, et al., "Substrate Pump Circuit and Method for I/O ESD Protection", U.S. Pat. No. 6,661,273, Dec. 9, 2003, it requires a complicated switching circuit to control ESD discharge and normal operation. In addition, this method uses PMOS current to pump the substrate to the ESD device, and PMOS is known to be slower than NMOS.

SUMMARY OF THE INVENTION

This invention provides ESD protection for input and I/O pins and can also be used for protecting power pins. It provides an ESD device that is fast and has a lower trigger voltage than the junction breakdown voltage. It is easy to achieve very low-level leakage for the ESD device during the normal operation, and an on-chip generator is not required to shut off the trigger-device leakage.

A preferred embodiment of the invention comprises first and second transistors formed in a substrate, each having a source, a drain and a gate, the source and drain of the first transaction being connected between ground and an I/O pin or input, the gate of the first transistor being connected to ground and the source and drain of the second transistor being connected between the substrate of the first transistor and the I/O pin or input; first and second capacitors con-

2 nected in series between ground and the I/O pin or input; and at least a third transistor connected between ground and a node between the first and second capacitors to which the gate of the second transistor is also connected.

BRIEF DESCRIPTION OF THE DRAWING

These and other objects and advantages of the invention will be more readily apparent from the following detailed descriptions in which:

FIG. 4 is a cross-sectional view of an alternative embodiment of the invention.

DETAILED DESCRIPTION

Figure 1:
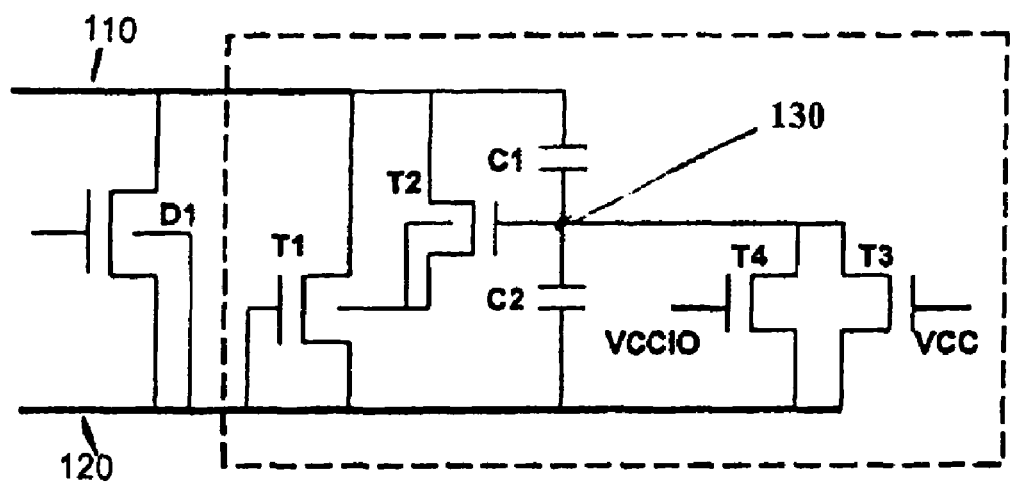
FIG. 1 is a schematic diagram of an illustrative embodiment of the ESD device of the present invention.

FIG. 1 is a schematic of a new ESD device 100 of the present invention. Device 100 includes NMOS transistors T1, T2, T3 and T4, coupling capacitors C1 and C2, and substrate diode D1 connected between an input or I/O pin 110 and a ground pin 120. The source and drain of transistor T1 are connected between pins 110 and 120, and the gate of transistor T1 is connected to ground pin 120. The drain of transistor T2 is connected to pin 110, and the source and substrate of transistor T2 are connected to the substrate of transistor T1. Capacitors C1 and C2 are connected in series between pins 110 and 120, and a node 130 between capacitors C1 and C2 is connected to the gate of transistor T2. The sources and drains of transistors T3 and T4 are connected between node 130 and ground pin 120. Diode D1 is implemented as an MOS I/O transistor having its source and drain connected between pins 110 and 120 and its substrate connected to ground pin 120.

A parasitic lateral NPN bipolar transistor is present in MOS transistor T1 in which the source and drain of the MOS transistor also constitute the emitter and collector of the bipolar transistor and the substrate constitutes the base of the bipolar transistor.

During normal operation, internal or core power supply VCC and input/output power supply VCCIO are applied to the gates of transistors T3 and T4, thereby turning them on. This connects the gate of transistor T2 to ground and shuts off transistor T2, eliminating any risk of false triggering by turning on transistor T2. Even if an I/O pin is used to support a PCI standard where the I/O pin voltage can be as high as 4.3V, transistor T2 is completely shut off. Note that transistor T2 is shut off regardless of whether VCC or VCCIO is powered up first. Since transistor T2 is shut off during operation, the pin leakage is very low.

Switching between the ESD discharge and the normal operation is very simple as compared to the prior art such as U.S. Pat. No. 6,661,273. During an ESD discharge between input or I/O pin and the ground pin, the internal or core power supply (VCC) and the input/output power supply (VCCIO) are floating, and transistors T3 and T4 are turned off. Substrate diode D1 from the I/O pull-down or the dummy I/O pull-down is used for ESD discharge when the input or the I/O pin voltage is negative relative to the ground. When the input or the I/O pin is positive relative to the ground, the voltage is capacitively coupled to the T2 gate with the ratio of the capacitances C1 and C2 determining the fraction of the drain voltage applied to the gate of T2. The gate-bias turns on transistor T2 and sends the channel current to the substrate of transistor T1. This turns on the parasitic NPN bipolar device in transistor T1 for the ESD discharge.

The trigger voltage of the parasitic NPN bipolar device is determined by the threshold-voltage (Vt2) of transistor T2 and the ratio (η) of C1 to C2. The trigger voltage is lower for lower Vt2 or higher η. Since an external base current is used to turn on the parasitic bipolar device, the turn-on voltage is much lower than the case when the junction breakdown of any NMOS is used to generate the base current for turning on its parasitic bipolar device. The trigger voltage can be as low as 3.5V or less.

There are several advantages of the current invention over the prior art. First, the switching between the ESD mode and the operation mode is much simpler compared to the prior art. Second, NMOS devices are used for the substrate pumping, and the substrate pumping is faster than using PMOS in the prior art. Third, this invention does not need an on-chip generator for shutting off the trigger devices like the one used in the prior art Ker and Hsu paper. The invention uses a very simple method to shut off the trigger device and provide low pin leakage. Fourth, the new ESD device is fast. This is due to fast capacitance coupling to turn on transistor T2 and fast turn-on of transistor T1. Since transistor T1 is a bipolar device, it is in general faster than an SCR device.

Since the ESD device has a significantly lower trigger voltage than the junction breakdown-voltage of the I/O pull-down device, all of the ESD current flows though the ESD device. Thus, the I/O devices can be made as small as allowed by the technology design rules and the drive-current requirement. Note that transistor T1 can also be made small due to uniform current flow in its parasitic bipolar device.

There are several important I/O standards including PCI with pin voltage at 4.3V, on-chip termination (OCT) with small NMOS device, and LVDS with stacked NMOS devices. Since the I/O circuits carry no ESD current, all the I/O standards can be supported with no concerns about ESD damage to the I/O circuits supporting the standards.

Figure 2:
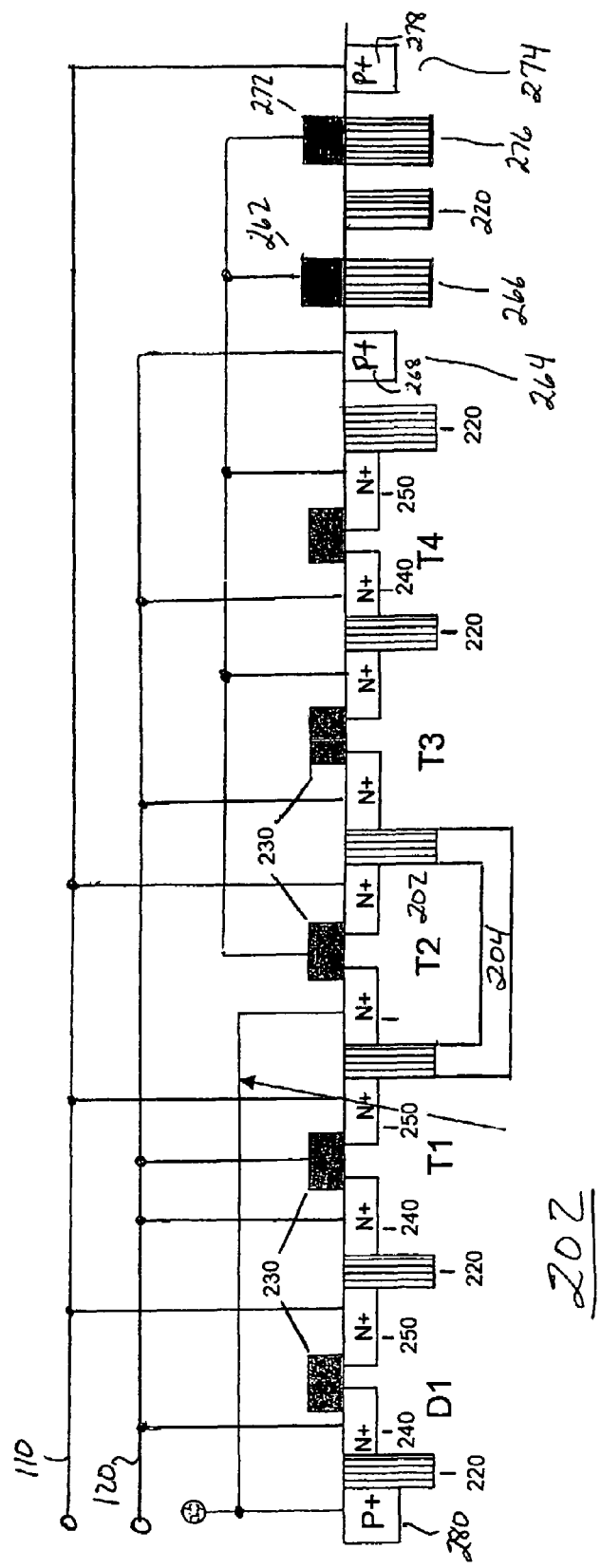
FIG. 2 is a cross-sectional view of an illustrative embodiment of the ESD device of the present invention.

A cross-section of an ESD device 200 that implements the circuit of FIG. 1 is shown in FIG. 2. ESD device 200 comprises diode D1, transistors T1, T2, T3 and T4 and capacitors C1 and C2 where each of elements D1, T1, T2, T3, T4, C1 and C2 has the same function as the correspondingly labeled element in FIG. 1. Each of these elements in formed in a substrate or well and is isolated from the other elements by field oxide regions 220. As indicated above, each of diode D1 and transistors T1-T4 is preferably an NMOS device and comprises a polysilicon gate 230 formed on an oxide layer (not shown) and N+ source and drain regions 240, 250 formed in P-well or P-substrate 207. A deep N-well 204 underlies transistor T2 and together with adjacent field oxide regions isolates transistor T2.

Capacitors C1 and C2 are formed using polysilicon traces 262, 272 formed on an oxide layer (not shown) and isolated portions 264, 274 of well 206. Advantageously, the dielectric in capacitors C1 and C2 comprises field oxide regions 266, 276 formed by the same process and at the same time as oxide regions 220 and an oxide layer formed by the same process and at the same time as the oxide layer under gates 230 of diode D1 and transistors T1-T4. The polysilicon gates 230 and polysilicon traces 262, 272 are formed by the same process at the same time. P+ regions 268, 278 provides ohmic contact of the remainder of well 206.

Figure 3:
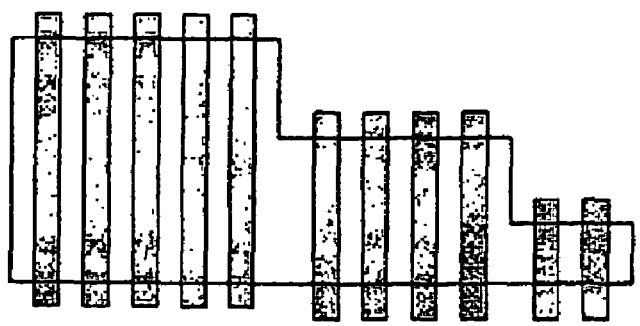
FIG. 3 is a top view of the illustrative embodiment of FIG. 2.

A mix of various I/O gate-finger lengths can be used for the layout as illustrated in FIG. 3. Thus, the new ESD device also provides great flexibility in the layout of devices in the I/O circuits. Moreover, any individual diode, transistor or capacitor can be implemented in a structure having more than one polysilicon finger. By way of example, as shown in FIG. 4, any one or more of the diode and transistors can be implemented in a multi-finger gate device having gate fingers 430 formed in the oxide layer (not shown) and source and drain regions 440, 450.

Figure 5:
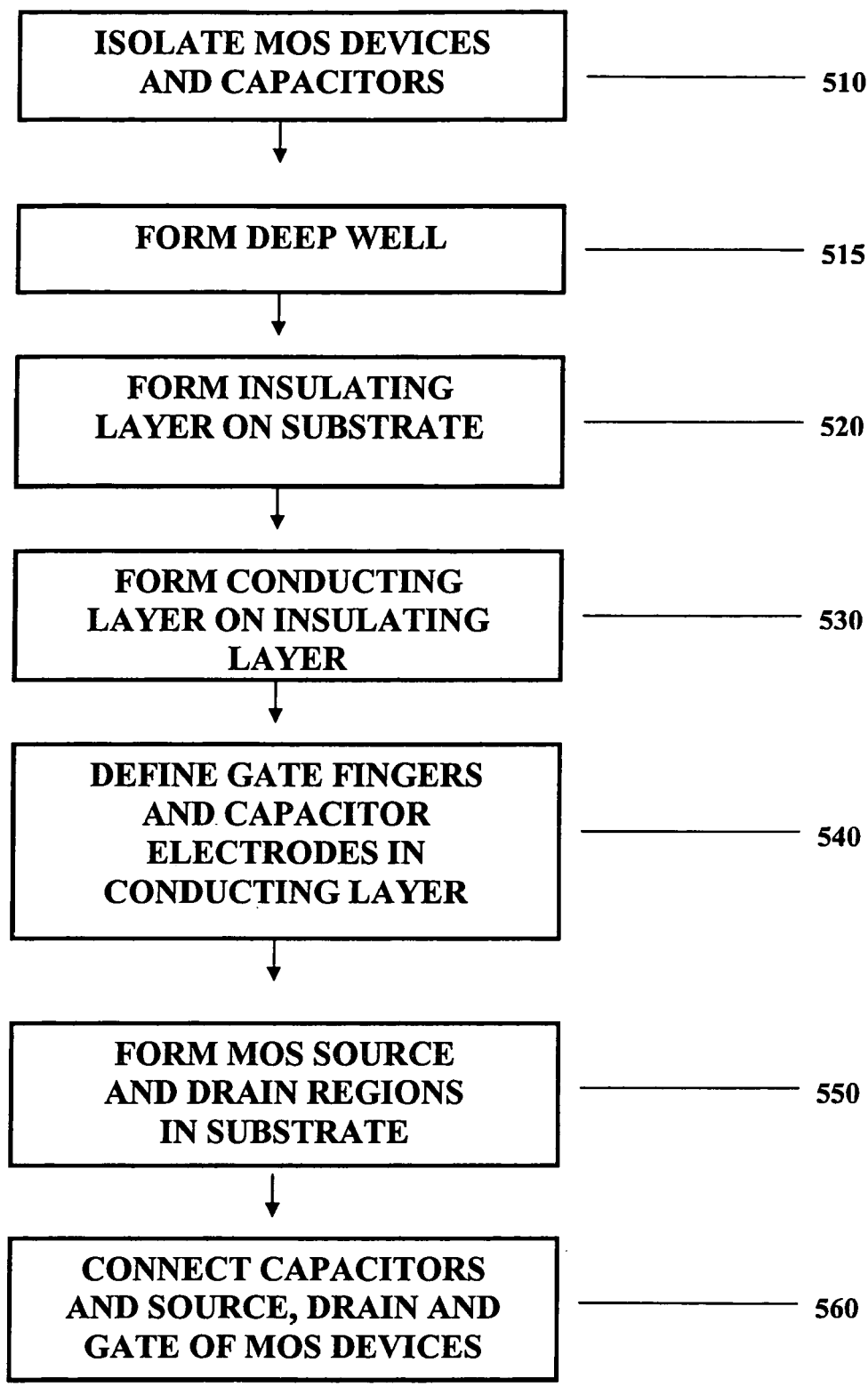
FIG. 5 is a flow chart depicting a method of practicing the invention.

FIG. 5 is a flow chart depicting an illustrative method of practicing the invention. Illustratively, the starting material is a substrate having a first conductivity type. To form NMOS devices, the first conductivity type is P.

At step 510, the MOS devices and the two capacitors are isolated by forming field oxide regions in the substrate separating each of the devices. Additional field oxide regions for use as capacitor dielectrics are formed at the same time. At step 515, a deep well of the second conductivity type is formed in the substrate so that it extends between the field oxide regions that will isolate MOS device T2 when it is formed. At step 520, an insulating layer such as silicon dioxide is formed on the substrate; and a conducting layer such as a polysilicon layer is formed at step 530 on top of the insulating layer. At step 540 the gate fingers of the MOS devices and the electrodes of the capacitors are defined by well-known photolithographic techniques in the conducting layer. At step 550, source and drain regions of the second conductivity type are formed in the substrate for each of the MOS devices D1, T1, T2 T3 and T4. Finally, at step 560, the sources, drains and gates of the MOS devices and the terminals of the capacitors are connected to complete the circuit. In particular, the source and drain of MOS device T1 are connected between ground and an I/O pin or input and the gate is connected to ground; and the source and drain of the MOS device T2 are connected between the substrate of the MOS device T1 and the I/O pin or input and the gate of the second MOS device is connected to a first node to which the capacitors are connected. The substrate of device T2 is also connected to the substrate of device T1 by a connection that is not shown. The source and drain of MOS device T3 and the source and drain of MOS device T4 are connected between ground and the first node. The source and drain of MOS device D1 are connected between ground and an I/O pin or input. One of the capacitor electrodes is connected to ground and the other electrode to the I/O pin or input.

As will be apparent to those skilled in the art, numerous variations of the above-described device and method may be practiced within the spirit and scope of the invention. While the invention has been described for the particular case of NMOS devices formed in a P well or P substrate, the invention may also be practiced using PMOS devices formed in an N well or N substrate. Moreover, the steps set forth in Figure may be performed in a different order from that set forth in FIG. 5.

What is claimed is:

1. An electrostatic discharge (ESD) device comprising:
    first and second capacitors connected in series between ground and an I/O pin, said capacitors being connected together at a first node,
    first and second transistors, each transistor having a source, a drain and a gate, the source and drain being formed in a substrate;
    the source and drain of the first transistor being connected between ground and the I/O pin and the gate of the first transistor being connected to ground;

the source and drain of the second transistor being connected between the substrate of the first transistor and the I/O pin and the gate of the second transistor being connected to the first node; and a third transistor having a source and drain connected between ground and the first node.

2. The ESD device of claim 1 wherein an internal power supply or an input/output power supply is applied to a gate of the third transistor.

3. The ESD device of claim 1 wherein the first and second transistors are NMOS transistors.

4. The ESD device of claim 1 further comprising a pull down device connected between ground and an I/O pin to protect the device against negative voltages on the I/O pin.

5. The ESD device of claim 4 wherein the pull down device is a substrate diode.

6. The ESD device of claim 4 wherein the pull down device is fifth transistor having a source and drain connected between ground and an I/O pin and a substrate connected to ground.

7. The ESD device of claim 1 where the substrate of the second transistor is connected to the substrate of the first transistor.

8. The ESD device of claim 1 wherein the first and second transistors are PMOS transistors.

9. An electrostatic discharge (ESD) device comprising:
first and second capacitors connected in series between ground and an I/O pin, said capacitors being connected together at a first node,
first and second transistors, each transistor having a source, a drain and a gate, the source and drain being formed in a substrate;
the source and drain of the first transistor being connected between ground and the I/O pin and the gate of the first transistor being connected to ground;
the source and drain of the second transistor being connected between the substrate of the first transistor and the I/O pin and the gate of the second transistor being connected to the first node;
a third transistor having a source and drain connected between ground and the first node; and
a fourth transistor having a source and drain connected between ground and the first node.

10. The ESD device of claim 9 wherein the third and fourth transistors are NMOS transistors.

11. The ESD device of claim 10 wherein an internal power supply is applied to a gate of the third transistor and an input/output power supply is applied to a gate of the fourth transistor.

12. An electrostatic discharge (ESD) device comprising:
first, second and third transistors, each transistor having a source, a drain and a gate, the source and drain of each transistor being formed in a substrate and each transistor being isolated from the other transistors;
first and second capacitors connected in series between ground and an I/O pin, said capacitors being connected together at a first node,
the source and drain of the first transistor being connected between ground and the I/O pin and the gate of the first transistor being connected to ground;
the source and drain of the second transistor being connected between the substrate of the first transistor and the I/O pin and the gate of the second transistor being connected to the first node; and
the source and drain of the third transistor being connected between ground and the first node.

13. The ESD device of claim 12 wherein an internal power supply or an input/output power supply is applied to a gate of the third transistor.

14. The ESD device of claim 12 wherein the first and second transistors are NMOS transistors.

15. The ESD device of claim 12 further comprising a pull down device connected between ground and an I/O pin to protect the device against negative voltages on an I/O pin.

16. The ESD device of claim 15 wherein the pull down device is a substrate diode.

17. The ESD device of claim 15 wherein the pull down device is fifth transistor having a source and drain formed in the substrate and connected between ground and an I/O pin and a substrate connected to ground.

18. The ESD device of claim 12 wherein the substrate of the second transistor is connected to the substrate of the first transistor.

19. An electrostatic discharge (ESD) device comprising:
first, second, third and fourth transistors, each transistor having a source, a drain and a gate, the source and drain of each transistor being formed in a substrate and each transistor being isolated from the other transistors;
first and second capacitors connected in series between ground and an I/O pin, said capacitors being connected together at a first node,
the source and drain of the first transistor being connected between ground and an I/O pin and the gate of the first transistor being connected to ground;
the source and drain of the second transistor being connected between the substrate of the first transistor and an I/O pin and the gate of the second transistor being connected to the first node; and
the source and drain of the third transistor being connected between ground and the first node; and
the source and drain of the fourth transistor being connected between ground and the first node.

20. The ESD device of claim 19 wherein the third and fourth transistors are NMOS transistors.

21. The ESD device of claim 20 wherein an internal power supply is applied to a gate of the third transistor and an input/output power supply is applied to a gate of the fourth transistor.

22. The ESD device of claim 12 wherein the first and second transistors are PMOS transistors.

* * * * *